United States Patent [19]
Shen et al.

[11] Patent Number: 5,563,087
[45] Date of Patent: Oct. 8, 1996

[54] METHOD OF FABRICATING INAS/GASB/ALSB MATERIAL SYSTEM SRAM

[75] Inventors: Jun Shen, Phoenix; Saied N. Tehrani, Scottsdale; Herbert Goronkin, Tempe; Xiaodong T. Zhu, Chandler, all of Ariz.

[73] Assignee: Motorola, Schaumburg, Ill.

[21] Appl. No.: 494,465

[22] Filed: Jun. 26, 1995

Related U.S. Application Data

[62] Division of Ser. No. 209,790, Mar. 11, 1994, abandoned.

[51] Int. Cl.$^6$ .............................. H01L 21/70; H01L 27/00
[52] U.S. Cl. .................. 437/52; 437/60; 437/126; 437/904
[58] Field of Search ............................ 437/52, 60, 177, 437/904, 126, 184–185, 133, 132, 22, 912, 47

[56] References Cited

U.S. PATENT DOCUMENTS

| | | | |
|---|---|---|---|
| 5,059,545 | 10/1991 | Frensley et al. | 437/31 |
| 5,345,097 | 9/1994 | Nakagawa | 437/126 |
| 5,416,040 | 5/1995 | Beam, III et al. | 437/60 |

*Primary Examiner*—H. Jey Tsai
*Attorney, Agent, or Firm*—Eugene A. Parsons

[57] ABSTRACT

An SRAM including first and second RITDs each formed with a heterostructure including a GaSb active layer sandwiched between AlSb barrier layers, which are sandwiched between InAs layers with each RITD having a contact connected to a first of the InAs layers. A TD including an AlSb layer sandwiched between InAs layers. A second InAs layer for each of the RITDs being integrally formed with a first InAs layer of the TD and a read/write terminal connected to a second InAs layer of the TD.

5 Claims, 3 Drawing Sheets

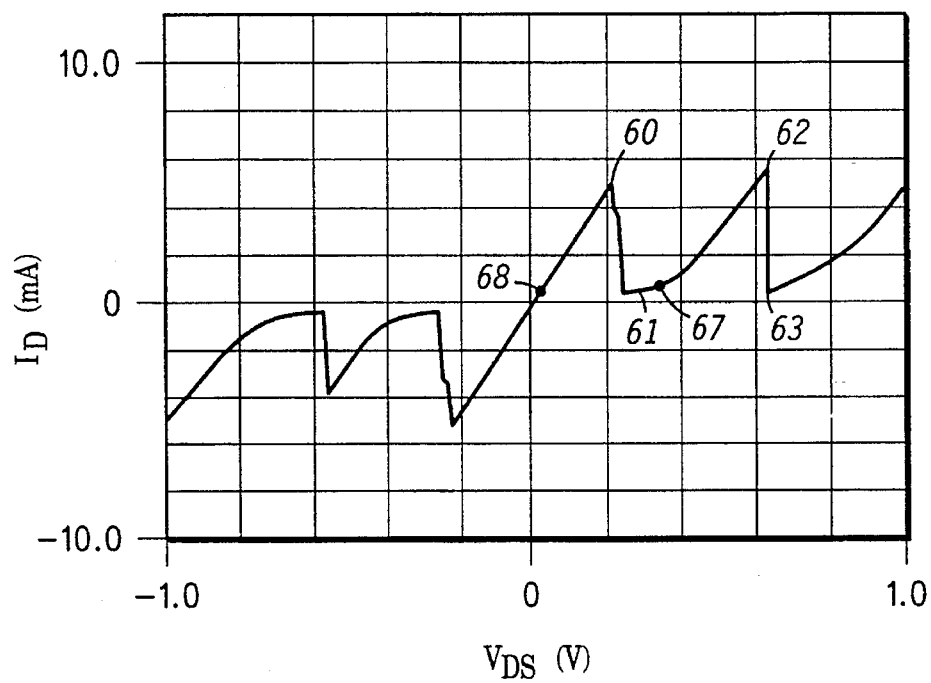
FIG. 3
FIG. 4
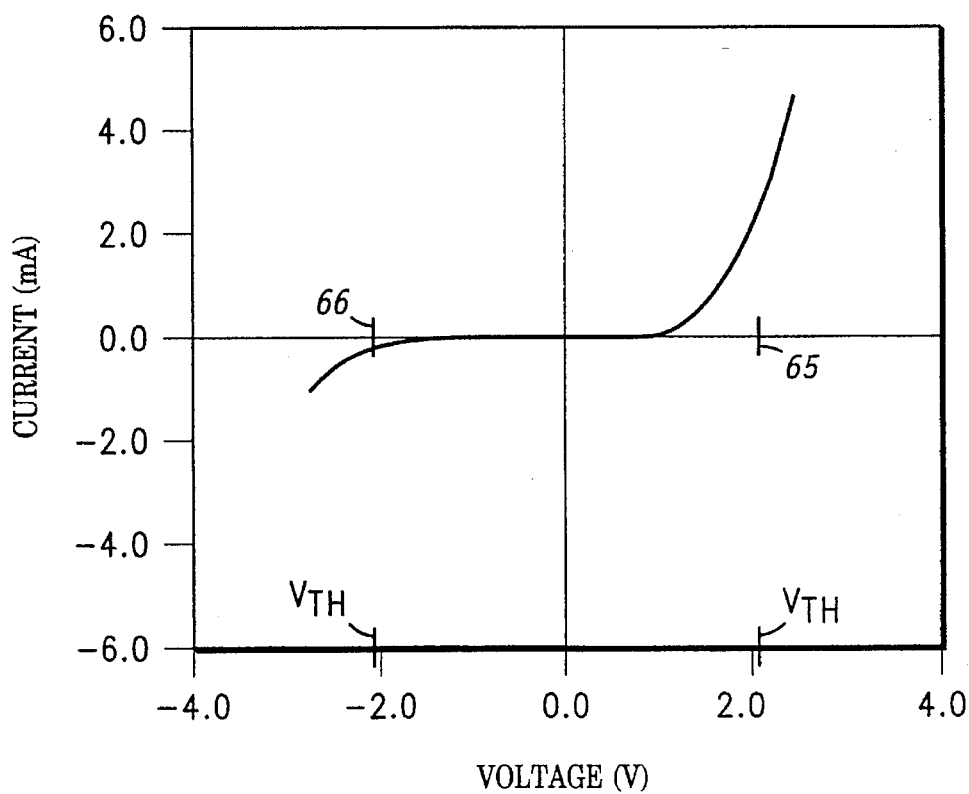

5,563,087

METHOD OF FABRICATING INAS/GASB/ALSB MATERIAL SYSTEM SRAM

This is a division of application Ser. No. 08/209,790, filed Mar. 11, 1994, abandoned.

FIELD OF THE INVENTION

The present invention pertains to static random access memories and more specifically to static random access memories with improved characteristics.

BACKGROUND OF THE INVENTION

Static random access memories (SRAM) are well known in the art and are formed in a great variety of different structures. Generally, an SRAM is a structure which is bistable, or has two operating points, and which functions equally well in either of the operating points. Further, the SRAM must be capable of being easily switched between the two operating points and must include some means of sensing in which operating point the SRAM is functioning.

SRAMs have been disclosed by Fujitsu Limited which include a double-emitter resonant-tunneling hot electron transistor (RHET) or two resonant-tunneling diodes stacked on a single barrier tunneling diode. The structures are fabricated by epitaxially growing a plurality of layers on an indium-phosphide (InP) substrate. The resonant tunneling barriers are formed by sandwiching an indium-gallium-arsenide (InGaAs) layer between aluminum-arsenide (AlAs) barriers. A collector barrier is formed of indium-aluminum-arsenide (InAlAs).

This type of SRAM has the advantages of being extremely small and utilizing substantially fewer transistors, or active devices, than conventional transistor SRAMs. The major problem with these structures is the fact that memory cells formed in this fashion have relatively larger power consumption and slower speed because of small peak-to-valley current ratios.

Accordingly, it is a purpose of the present invention to provide a new and improved SRAM.

It is a further purpose of the present invention to provide a SRAM with the advantages of being extremely small and utilizing substantially fewer transistors, or active devices, than conventional transistor SRAMs and which has substantially improved speed/power ratio.

It is another purpose of the present invention to provide a SRAM which is relatively simple to fabricate.

SUMMARY OF THE INVENTION

The above problems and others are at least partially solved and the above purposes and others are realized in a static random access memory including first and second resonant interband tunneling diodes (RITDs) each formed with a heterostructure including a gallium-antimonide (GaSb) active layer sandwiched between aluminum-antimonide (AlSb) barrier layers, which are further sandwiched between first and second layers of indium-arsenide (InAs) and each (RITD) has a bias terminal connected to the first InAs layer thereof. A tunneling diode (TD) is formed by sandwiching a layer of AlSb between first and second layers of InAs. The second layer of InAs for each of the first and second RITDs is integrally formed with the first layer of InAs of the TD, and a read/write terminal is connected to the second layer of InAs of the TD.

Because of the material system utilized in forming the RITDs and the TD and because of the resonant interband tunneling, the structure has substantially improved peak-to-valley (P/V) ratios which substantially improves the speed/power ratio of the device.

BRIEF DESCRIPTION OF THE DRAWINGS

Referring to the drawings:

FIG. 3 is a graphic representation of current versus voltage in a pair of resonant interband tunneling diodes connected in series; and FIG. 4 is a graphic representation of current versus voltage in a typical tunneling diode.

DESCRIPTION OF THE PREFERRED EMBODIMENT

Figure 1:
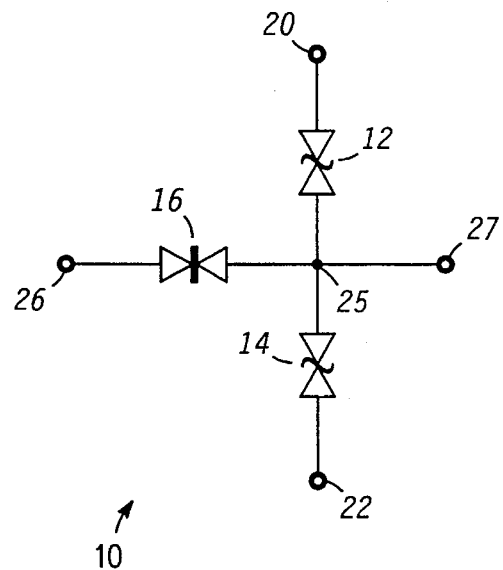
FIG. 1 is a schematic representation of an SRAM cell incorporating heterostructure devices.

Referring specifically to FIG. 1, a schematic representation of a static random access memory (SRAM) cell 10 incorporating heterostructure devices is illustrated. SRAM cell 10 includes a first resonant interband tunneling diode (RITD) 12, a second resonant interband tunneling diode (RITD) 14 and a tunneling diode (TD) 16 RITD 12 has an external terminal 20, which in this case is the anode, adapted to have a positive bias source connected thereto. RITD 14 has an external terminal 22, which in this case is the cathode, adapted to have a negative (relative to terminal 20) bias source connected thereto. The cathode of RITD 12 and the anode of RITD 14 are connected together at a junction 25. Also connected to junction 25 is one terminal of tunneling diode 16, with the other terminal 26 of tunneling diode 16, and/or junction 25, being externally available for read/write functions in the utilization of SRAM cell 10.

Figure 2:
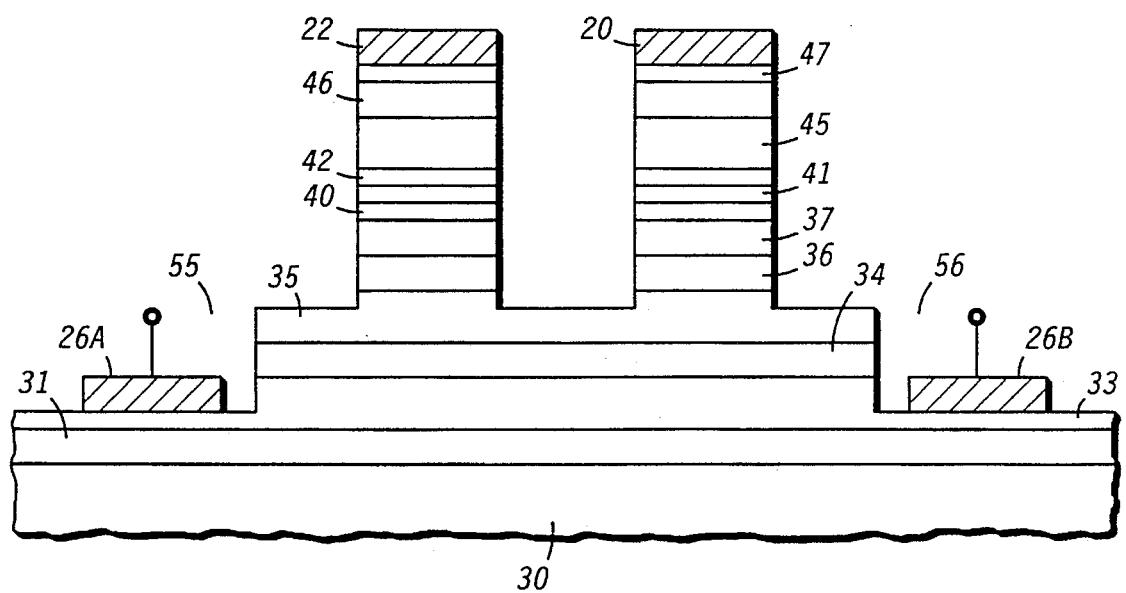
FIG. 2 is a simplified sectional view of an SRAM, portions thereof broken away, in accordance with the present invention.

Referring specifically to FIG. 2, a simplified cross-sectional view of an SRAM is illustrated, portions thereof broken away, including SRAM cell 10. It will of course be understood that the SRAM includes a large number of individual cells generally organized into rows and columns and connected so that each cell is individually addressable. Since each of the cells are alike, only single SRAM cell 10 will be explained in detail.

The SRAM is fabricated on a substrate 30 formed of gallium/arsenide (GaAs) and having a substantially planar surface. A buffer layer 31 including gallium-antimonide/aluminum antimonide (GaSb/AlSb) superlattices is epitaxially grown on the surface of substrate 30 to substantially lattice match the remaining structure and reduce the dislocation density. A plurality of heterostructure layers are then epitaxially grown on buffer layer 31 including: an indium-arsenide (InAs) layer 33; an aluminum antimonide (AlSb) layer 34; at least one InAs layer 35, 36, 37; a barrier layer 40 of AlSb; an active layer 41 of GaSb; a barrier layer 42 of AlSb; and at least one InAs layer 45, 46, 47.

The following structure is an example of an SRAM and more specifically is a specific example of SRAM cell 10 provided to illustrate the fabrication thereof. It will of course be understood that different materials and different dimensions can be utilized for the various layers and the following is simply one specific example. In this specific example, first InAs layer 33 is grown directly on buffer layer 32 to a thickness of approximately 5000 angstroms and is doped for n+ type conduction. An AlSb layer 34 is grown on first n+ InAs layer 33 to a thickness in the range of approximately 100 to 1000 angstroms. It has been found advantageous to form AlSb layer 34 in the lower portion of this range, and preferably in a range of approximately 100 to 400 angstroms, because of other fabrication steps to be explained presently. A second n+ InAs layer 35 is grown on AlSb layer 34 to a thickness of approximately 3000 angstroms and is relatively heavily doped with silicon ions, Si, to a density of approximately $2 \times 10^{18}$ cm$^{-3}$ to provide n+ type of conduction. As will be seen presently, the first three layers 33, 34 and 35 are utilized to form TD 16.

A first n− InAs layer 36 is grown on second n+ InAs layer 35 to a thickness of approximately 500 angstroms and is relatively lightly doped with silicon ions, Si, to a density of approximately $2 \times 10^{16}$ cm$^{-3}$. A first undoped InAs tunneling layer 37 is grown on first n− InAs layer 36 to a thickness of approximately 100 angstroms. A first barrier layer 40 of AlSb is grown on first undoped InAs layer 37 to a thickness of approximately 25 angstroms. An active layer 41 of GaSb is grown on first barrier layer 40 of AlSb to a thickness of approximately 65 angstroms. A second barrier layer 42 of AlSb is grown on active layer 41 of GaSb to a thickness of approximately 25 angstroms. A second undoped tunneling layer 45 of InAs is grown on second barrier layer 42 of AlSb to a thickness of approximately 100 angstroms. A second n− InAs layer 46 is grown on second undoped layer 45 of InAs to a thickness of approximately 500 angstroms and doped with silicon ions, Si, to a density of approximately $2 \times 10^{16}$ cm$^{-3}$ to provide n− type of conduction. Finally, a second n+ InAs layer 47 is grown on second n− InAs layer 46 to a thickness of approximately 2500 angstroms and doped with silicon ions, Si, to a density of approximately $2 \times 10^{18}$ cm$^{-3}$ to provide n+ type of conduction.

To fabricate SRAM cell 10 from the structure described above, first and second contacts are defined on the surface of second n+ InAs layer 47 by some convenient means such as photoresist. It should be understood that the present method is being described only with reference to SRAM cell 10 for convenience but it will be understood that a complete SRAM with a large plurality of cells will generally be fabricated and the present steps are simply expanded to form the plurality of cells. Once the contacts are defined, metal terminals 20 and 22 are deposited on the defined contacts by some convenient method, such as evaporation and lift-off. In the present embodiment, the metal utilized is nickel/gold/germanium (Ni/Au/Ge). Metal terminals 20 and 22 are then used as a mask for much of the remaining process.

InAs layers 47, 46 and 45 are then selectively etched through, with metal terminals 20 and 22 being used as a mask, utilizing a first solution of CH$_3$COOH:H$_2$O$_2$:H$_2$O in a ratio of approximately 5:1:5. The first solution is selected because it is effective to substantially etch only the InAs layers. Barrier layer 42, active layer 41 and barrier layer 40 are then selectively etched, using metal terminals 20 and 22 and the two columns of InAs thereunder (unetched portions of layers 47, 46 and 45) as a mask, utilizing a second solution of NH$_4$OH:H$_2$O in a ratio of approximately 10:1. Finally, InAs layers 37, 36 and 35 are partially selectively etched, utilizing some of the first solution to separate the structure into, and define, two resonant interband tunneling diodes 12 and 14.

The entire structure is then covered with a layer of insulating, or dielectric, material (not shown) to serve as a passivation and masking-layer. In this specific example a layer of Si$_3$N$_4$ approximately 500 angstroms thick is utilized. Bottom contact regions 55 and 56 on the upper surface of the remaining portion of layers 47, 46 and/or 45 are defined and opened by removing the portion of the layer of Si$_3$N$_4$ over bottom contact regions 55 and 56. A portion of the first etching solution is then used to etch through the remaining portion of InAs layers 47, 46 and/or 45 in the bottom contact regions 55 and 56. A portion of the second etching solution is then used to etch through AlSb layer 34 in the bottom contact regions 55 and 56.

At this point it should be noted that AlSb layer 34 is etched very rapidly by the second etching solution and there is a strong tendency for this to be a non-isotropic etch, i.e. non-directional, and, generally, AlSb layer 34 is etched horizontally faster than it is etched vertically. Thus it is preferred to concentrate the second etching solution as much as possible and to grow AlSb layer 34 as thin as possible while still retaining the desired characteristics to limit the horizontal etching as much as possible. Generally, when AlSb layer 34 is kept to a thickness in the range of 100 to 400 angstroms and the second etching solution has a ratio no less than a 10:1 ratio the results have been found to be satisfactory.

Finally, a portion of the first solution is utilized to selectively etch partially through InAs layer 33. At this stage it is generally helpful to redefine bottom contact regions 55 and 56 with some masking material, such as photoresist or the like. A pair of metal contacts 26A and 25B are formed on the exposed surface of InAs layer 33 in bottom contact regions 55 and 56 by some convenient method, such as evaporation and lift-off. In this specific example the metal utilized for contacts 26A and 26B can be the same as metal contacts 20 and 22, i.e. Ni/Au/Ge.

A mesa etch is then performed, utilizing some convenient etch, e.g. the first solution, to separate SRAM cell 10 from adjacent cells on substrate 30. The entire SRAM on substrate 30 is then passivated with a layer (not shown) of insulative or dielectric material, such as Si$_3$N$_4$. Holes, or vias, are opened through the passivation layer to provide contact with metal contacts 20, 22, 26A and 26B and interconnect metal is deposited by some convenient method, such as evaporation to connect all of the cells into addressable rows and columns.

Referring specifically to FIG. 3, a graphical representation of current flowing through RITDs 12 and 14 versus the voltage applied between contacts 20 and 22 is illustrated. As a bias potential is applied across RITD 12, for example, the valence band energy level of active layer 41 aligns with the energy levels of InAs layers 37 and 45 on either side of barrier layers 40 and 42, respectively, and current increases from zero to point 60. An additional increase in bias potential causes the energy level of active layer 41 to quite rapidly become misaligned with the energy levels of InAs layers 37 and 45, resulting in a substantial valley, designated 61. Because two RITDs 12 and 14 are connected in series, further increase in the bias potential again causes an increase in current, as illustrated by the curve to the right of point 61 again peaking at a point 62.

The resonant tunneling from the conduction band of InAs layer 45 to the valence band of GaSb active layer 41 and then to the conduction band of InAs layer 37 or, conversely, the resonant tunneling from the conduction band of InAs layer 37 to the valence band of GaSb active layer 41 and then to the conduction band of InAs layer 45 is referred to as interband tunneling. Each of the resonant interband tunneling diodes 12 and 14 are constructed to operate utilizing interband tunneling which substantially reduces the valley current because of the large bandgap that must be traversed by valley (leakage) current during the times that the energy levels of the bands are misaligned.

In SRAM cell 10, because an InAs/GaSb/AlSb material system, or heterostructure, is utilized to achieve interband tunneling, the peak-to-valley current ratio is substantially greater than many other material systems. This results in a substantial increase in the speed/power ratio of the device. Also, relatively low potentials and potential changes are required for this material system, resulting in further reduced power consumption. Further, the change from point 60 to point 61 or from point 62 to point 63 is very rapid in the present material system so that the operating speed of SRAM cell 10 is substantially increased.

Referring to FIG. 4, a graphical representation of voltage applied to TD 16 versus current flowing in TD 16. As indicated by the curve, current normally does not flow in TD 16 until either a positive threshold voltage 65 or a negative threshold voltage 66 is applied thereto. Once positive threshold voltage 65 is surpassed, positive current through TD 16 increases exponentially. Similarly, once negative threshold voltage 66 is surpassed negative current through TD 16 increases exponentially.

Figure 5:
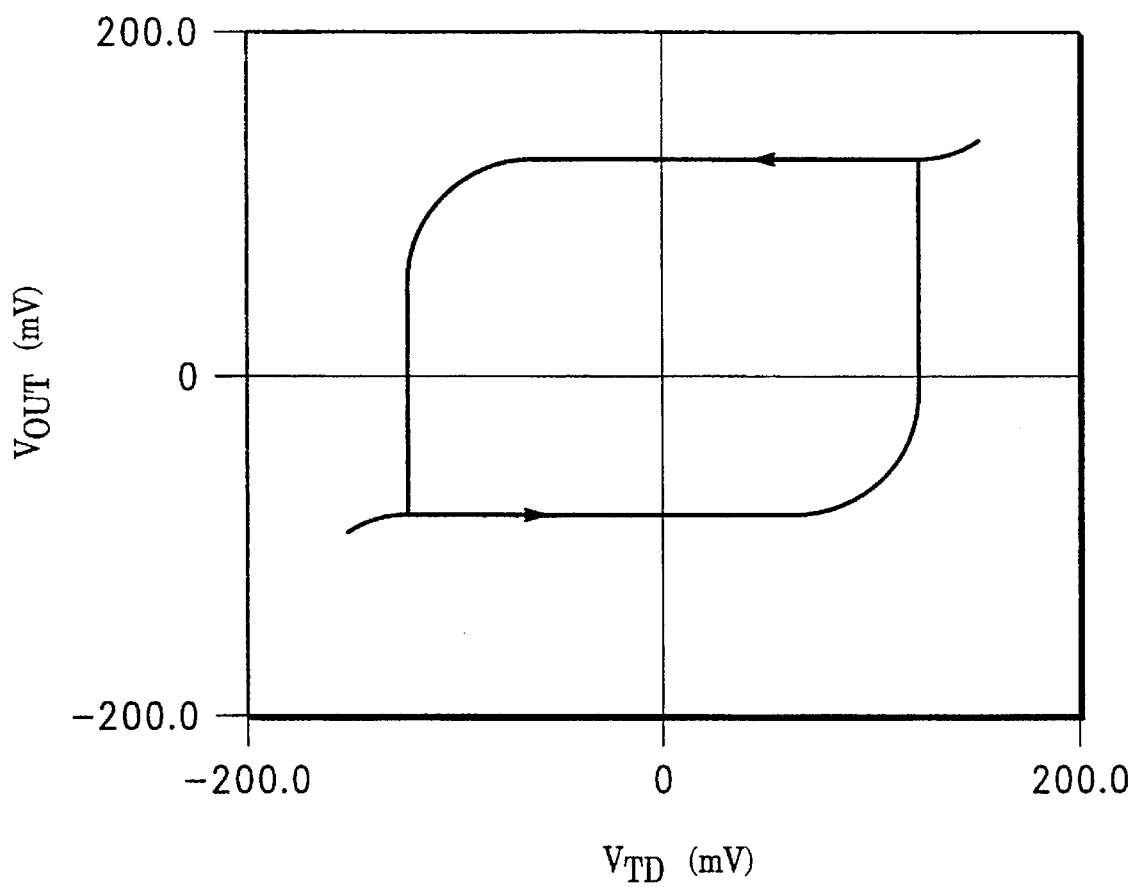
FIG. 5 is a graphical representation of the bistable operation of the SRAM of FIG. 2.

Referring specifically to FIG. 5, the bistable operation which results from combining TD 16 with RITDs 12 and 14 is illustrated graphically. In FIG. 5 the horizontal axis represents a voltage, $V_{TD}$, across TD 16 and the vertical axis represents the output voltage, $V_{out}$, at terminal 27 of FIG. 1. A fixed voltage is applied to each contact 20 and 22, for example +0.14 V and −0.14 V, respectively. When a positive signal is applied to input contact 26A or 26B sufficient to overcome threshold voltage 65 of TD 16, the voltage across RITD 14 is increased sufficiently to move it beyond point 60 and into valley 61, for example to point 67. From FIG. 1 it is clear that the current flowing in RITD 14 is a combination of current from RITD 12 and TD 16. Assume, for example, that the voltage applied to input contact 26A or 26B is a pulse that drives RITD 14 to point 67 and then is removed. Since the current flowing in RITD 12 must be the same as the current flowing in series connected RITD 14, RITD 12 is driven to operate at point 68 in FIG. 3. This first stable operating condition can be referred to as a logic high.

Similarly, when a negative signal is applied to input contact 26A or 26B sufficient to overcome threshold voltage 66 of TD 16, the voltage across RITD 12 is increased sufficiently to move it beyond point 60 and into valley 61, for example to point 67. Since the current flowing in RITD 14 must be the same as the current flowing in RITD 12, RITD 14 is driven to operate at point 68 in FIG. 3. This second stable operating condition can be referred to as a logic low. Thus, bistable operation is achieved. Further, whether SRAM cell 10 is in the logic high or logic low condition can be determined at contact 26A or 26B in a variety of different ways, one of which is to apply a "sense" current to contact 26A or 26B to determine whether current flows into or out of contact 26A or 26B. Another contact, for example contact 27 (see FIG. 1), could also be supplied to junction 25 and the voltage at this point could be sensed.

Accordingly, a new and improved SRAM is disclosed which has the advantages of being extremely small and utilizing substantially fewer transistors, or active devices, than conventional transistor SRAMs and which has substantially improved speed/power ratio. Further, the improved SRAM is relatively simple to fabricate. Because of the material system utilized in forming the RITDs and the TD, of the improved SRAM, the structure has substantially improved peak-to-valley (P/V) ratios which substantially improves the speed/power ratio of the device.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a static random access memory cell structure comprising the steps of:

providing a GaAs substrate having a substantially planar surface;

growing a buffer layer of superlattices on the surface of the substrate;

forming a first InAs layer on the buffer layer, an AlSb layer on the first InAs layer, a second InAs layer on the AlSb layer, a first barrier layer of AlSb on the second InAs layer, an active layer of GaSb on the first barrier layer of AlSb, a second barrier layer of AlSb on the active layer of GaSb, and a third InAs layer on the second barrier layer of AlSb,;

defining first and second contacts on the third InAs layer and depositing metal terminals on the defined first and second contacts;

selectively etching the third InAs layer using the metal terminals as a mask;

selectively etching the second barrier layer of AlSb, the active layer of GaSb, and the first barrier layer of AlSb using the metal terminals as a mask;

selectively partially etching the second InAs layer to separate and define the structure into two resonant tunneling diodes;

depositing an insulating layer over the entire structure after selectively partially etching the second InAs layer;

opening at least one bottom contact region on a surface of the partially etched second InAs layer adjacent one of the defined resonant tunneling diodes by selectively removing a portion of the insulating layer;

selectively etching any remaining portion of the second InAs layer in the bottom contact region;

selectively etching the AlSb layer in the bottom contact region;

selectively partially etching the first InAs layer in the bottom contact region to expose a surface of the first InAs layer; and depositing a third metal terminal on the exposed surface of the first InAs layer.

2. A method of fabricating a static random access memory cell structure as claimed in claim 1 wherein the step of growing a buffer layer of superlattices includes growing the buffer layer epitaxially.

3. A method of fabricating a static random access memory cell structure as claimed in claim 1 wherein the step of forming AlSb and InAs layers includes forming the layers epitaxially.

4. A method of fabricating a static random access memory structure comprising the steps of:

providing a GaAs substrate having a substantially planar surface;

epitaxially growing a buffer layer including superlattices on the surface of the substrate;

epitaxially growing a first n+ InAs layer on the buffer layer, an AlSb layer on the first n+ InAs layer, a second n+InAs layer on the AlSb layer, a first n– InAs layer on the second n+ InAs layer, a first undoped InAs layer on the first n– InAs layer, a first barrier layer of AlSb on the first undoped InAs layer, an active layer of GaSb on the first barrier layer of AlSb, a second barrier layer of AlSb on the active layer of GaSb, a second undoped layer of InAs on the second barrier layer of AlSb, a second n– InAs layer on the second undoped layer of InAs, and a third n+ InAs layer on the second n– InAs layer;

defining first and second contacts on the third n+ InAs layer and depositing metal terminals on the defined first and second contacts;

selectively etching the third n+ InAs layer, the second n– InAs layer, and the second undoped layer of InAs using the metal terminals as a mask;

selectively etching the second barrier layer of AlSb, the active layer of GaSb, and the first barrier layer of AlSb using the metal terminals as a mask;

selectively partially etching the first undoped InAs layer and the first n– InAs layer to separate and define the structure into two resonant tunneling diodes;

depositing an insulating layer over the entire structure after selectively partially etching the first undoped InAs layer and the first n– InAs layer;

opening at least one bottom contact region on a surface of the partially etched first n– InAs layer adjacent one of the defined resonant tunneling diodes by selectively removing a port ion of the insulating layer;

selectively etching any remaining portion of the first n– InAs layer in the bottom contact region and the second n+ InAs layer;

selectively etching the AlSb layer in the bottom contact region;

selectively partially etching the first n+ InAs layer in the bottom contact region to expose a surface of the first n+ InAs layer; and depositing a third metal terminal on the exposed surface of the first n+ InAs layer.

5. A method of fabricating a static random access memory structure as claimed in claim 4 wherein the steps of depositing metal terminals on the defined contacts and depositing a third metal terminal include depositing the metal by evaporative lift-off methods.

* * * * *